(12) United States Patent
Alcorn et al.

(10) Patent No.: US 10,483,673 B2
(45) Date of Patent: Nov. 19, 2019

(54) INTERPOSER DEVICE

(71) Applicant: Hewlett-Packard Development Company, L.P., Houston, TX (US)

(72) Inventors: Byron A Alcorn, Fort Collins, CO (US); Shane Ward, Windsor, CO (US); Peter Andrew Seiler, Wellington, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 58 days.

(21) Appl. No.: 15/543,193

(22) PCT Filed: Jan. 28, 2015

(86) PCT No.: PCT/US2015/013230
§ 371 (c)(1),
(2) Date: Jul. 12, 2017

(87) PCT Pub. No.: WO2016/122476
PCT Pub. Date: Aug. 4, 2016

(65) Prior Publication Data
US 2018/0006391 A1    Jan. 4, 2018

(51) Int. Cl.
*H01R 12/00* (2006.01)
*H05K 1/00* (2006.01)
(Continued)

(52) U.S. Cl.
CPC ........... *H01R 12/778* (2013.01); *G06F 1/185* (2013.01); *G06F 13/409* (2013.01);
(Continued)

(58) Field of Classification Search
CPC ..... H01R 9/096; H01R 23/722; H01R 23/725
(Continued)

(56) References Cited

U.S. PATENT DOCUMENTS 5,923,529 A * 7/1999 Mimachi ............... G06F 13/409
                                                    361/679.31
6,327,150 B1 * 12/2001 Levy .................... G11B 25/043
                                                    324/73.1
(Continued)

FOREIGN PATENT DOCUMENTS

| CN | 202231177 U | 5/2012 |
|---|---|---|
| CN | 203012606 U | 6/2013 |

(Continued)

OTHER PUBLICATIONS

Bplus Technology Co., Ltd., 'P12S-P12F M.2 (NGFF)' Retrieved Jan. 18, 2017, Available online at: http://www.hwtools.net/ExtenderBoard/P12S-P12F.html.
(Continued)

*Primary Examiner* — Abdullah A Riyami
*Assistant Examiner* — Thang H Nguyen
(74) *Attorney, Agent, or Firm* — Fabian VanCott

(57) ABSTRACT

An interposer for connecting a module to an M.2 socket includes a different form factor connector. The interposer includes an M.2 connector to couple the interposer to the M.2 socket. The M.2 connector is formed to mate with the M.2 socket. The interposer includes a different form factor socket to couple the interposer to the module including the different form factor connector. The different form factor socket is formed to mate with the different form factor connector.

20 Claims, 11 Drawing Sheets

(51) Int. Cl.
    *H01R 12/77*     (2011.01)
    *G06F 1/18*     (2006.01)
    *H05K 1/14*     (2006.01)
    *H05K 3/36*     (2006.01)
    *H05K 7/14*     (2006.01)
    *H01R 12/70*     (2011.01)
    *H01R 12/79*     (2011.01)
    *H01R 13/35*     (2006.01)
    *G06F 13/40*     (2006.01)
    *H05K 1/11*     (2006.01)

(52) U.S. Cl.
    CPC ......... *H01R 12/7047* (2013.01); *H01R 12/79* (2013.01); *H01R 13/35* (2013.01); *H05K 1/141* (2013.01); *H05K 1/144* (2013.01); *H05K 3/368* (2013.01); *H05K 7/142* (2013.01); *H05K 1/117* (2013.01); *H05K 2201/042* (2013.01); *H05K 2201/10189* (2013.01); *H05K 2201/10287* (2013.01); *H05K 2201/10325* (2013.01); *H05K 2201/10378* (2013.01); *H05K 2201/2036* (2013.01)

(58) Field of Classification Search
    USPC .......................................... 439/65, 74, 638
    See application file for complete search history.

(56) References Cited

U.S. PATENT DOCUMENTS

| | | | | |
|---|---|---|---|---|
| 6,527,562 | B2* | 3/2003 | Tanaka | G06F 1/181 |
| | | | | 361/789 |
| 6,796,804 | B2* | 9/2004 | Correa | H05K 1/144 |
| | | | | 439/61 |
| 7,419,379 | B2* | 9/2008 | Wu | G06F 1/184 |
| | | | | 439/65 |
| 7,445,457 | B1* | 11/2008 | Frangioso, Jr. | H05K 1/115 |
| | | | | 361/805 |
| 7,637,784 | B2* | 12/2009 | Evans | H01R 31/065 |
| | | | | 439/638 |
| 7,685,705 | B2* | 3/2010 | Nulty | G01R 1/07314 |
| | | | | 29/832 |
| 8,070,522 | B2* | 12/2011 | Shtargot | H05K 7/1492 |
| | | | | 439/638 |
| 2004/0024940 | A1 | 2/2004 | Chiu | |
| 2004/0102087 | A1* | 5/2004 | Berens | G06F 1/184 |
| | | | | 439/534 |
| 2005/0221633 | A1* | 10/2005 | Wildes | H01R 9/096 |
| | | | | 439/67 |
| 2010/0254096 | A1* | 10/2010 | Kim | G06F 1/185 |
| | | | | 361/737 |
| 2012/0021624 | A1* | 1/2012 | Tuma | G06F 1/185 |
| | | | | 439/76.1 |
| 2012/0191402 | A1* | 7/2012 | Filler | G06F 11/263 |
| | | | | 702/119 |
| 2013/0237092 | A1* | 9/2013 | Rubens | H01R 13/6596 |
| | | | | 439/607.23 |
| 2013/0294023 | A1* | 11/2013 | Gay | G06F 1/187 |
| | | | | 361/679.31 |
| 2014/0334089 | A1* | 11/2014 | Schade | G06F 1/183 |
| | | | | 361/679.32 |

FOREIGN PATENT DOCUMENTS

| | | |
|---|---|---|
| CN | 203690574 U | 7/2014 |
| CN | 203800345 U | 8/2014 |
| KR | 1020100030126 A | 3/2010 |
| KR | 1020110028999 A | 3/2011 |
| TW | M474270 U | 3/2014 |
| WO | WO-2010123502 | 10/2010 |

OTHER PUBLICATIONS

Gen3 M.2 Interposers Quick Start for Summit Analyzers, 2013, pp. 1-8, Teledyne Lecroy, Inc.

Keysight U4301B PCI Express 3.0 Analyzer Module, Data Sheet, Sep. 19, 2014, pp. 1-17, Keysight Technologies.

* cited by examiner

INTERPOSER DEVICE

BACKGROUND

M.2 is a specification for expansion cards and their associated sockets used in computing devices. Standards regarding physical lengths and widths making up the form factors of M.2 devices are defined by the Peripheral Component Interconnect Special Interest Group's (PCI SIG) revision 1.0 of the M.2 specifications provided December 2013. M.2-associated technologies and standards may be applied in computing devices that utilize for example, solid-state storage devices (SSDs) in computing devices such as laptop computing devices, workstations, server computing devices, tablets, and smart phones, as well as all other types of computing devices.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1A:
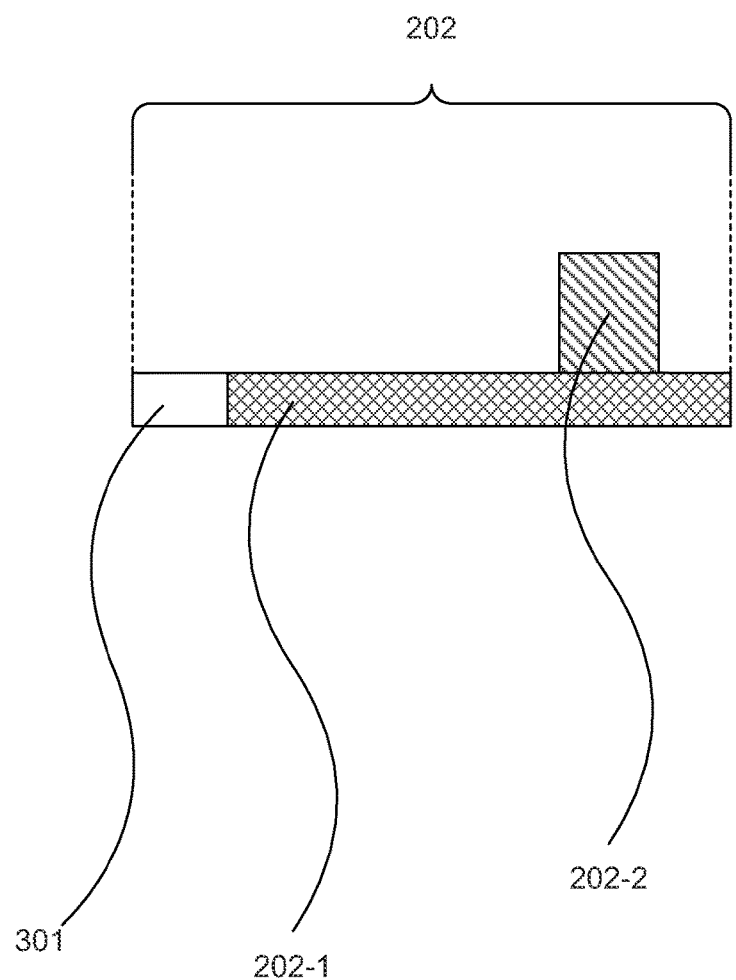
FIG. 1A is a block diagram of an interposer for connecting a module to an M.2 socket comprising a different form factor connector, according to one example of the principles described herein.

M.2 computing devices and interfaces support internally mounted computer expansion cards or modules. Internal M.2 standard connections are used to mount the computer modules for use by a host computing system. Computer bus interfaces provided through the M.2 connector standard, together with supported logical interfaces, are a superset to those standards defined by the SATA interface standards. The M.2 standard provides support for PCI Express 3.0, Serial ATA (SATA) 3.0, and internal universal serial bus (USB) 3.0 interfaces.

M.2 interfaces include a number of varying keying layouts and form factors wherein pin assignments and notches in the M.2 interfaces differ among types of modules. Thus, modules of different types have different keying layouts. These different module types include solid-state drive (SSD) modules, wireless wide area network (WWAN) connectivity modules, WI-FI communication modules, BLUETOOTH communication modules, serial ATA (SATA) compliant modules, serial attached SCSI (SAS) compliant modules, peripheral component interconnect express (PCIe) compliant modules, satellite navigation modules, near field communication (NFC) modules, and digital radio modules, among many other types of modules. These different types of modules may use A, B, C, D, E, F, G, H, J, K, L, and M key identifications, and combinations thereof. In one example, the modules may use four main key identifications; A, B, E, and M. With these available interfaces, different modules may be created. For example, the M key is defined as an SSD module including an interface with four PCIe lanes. With these four PCIe lanes, the interface may be used to create any number of modules including, for example, a SAS controller module, a navigation module, or a digital radio module. A USB interface may also allow the modules mentioned herein to be created depending on bandwidth and latency requirements of the host computing device.

With these various key layouts for these various modules, a user may wish to add, for example, an SSD module to their host-computing device where an incompatibly keyed M.2 socket on the motherboard of the host-computing device is available. In this case, the user cannot install their SSD module. This incompatibility may be further exasperated by the fact that only a few unallocated M.2 sockets are present on the motherboard given the limited motherboard space available. While there are some modules that support two key layouts such as, for example E and A, or B and M, trade-offs are made in both features and performance in order for these modules to work in multiple sockets.

It is impractical to allocate board area for a specifically keyed socket for a correspondingly keyed module type. If multiple types of module keys were needed, board space and dedicated sockets would also be required along with dedicated input/output (I/O) to support the interfaces defined on the sockets.

Examples described herein provide an interposer for connecting a module to an M.2 socket comprising a different form factor connector. The interposer includes an M.2 connector to couple the interposer to the M.2 socket. The M.2 connector is formed to mate with the M.2 socket. The interposer also includes a different form factor socket to couple the interposer to the module including the different form factor connector. The different form factor socket is formed to mate with the different form factor connector. The different form factor socket and different form factor connector comprise a differently keyed M.2 socket and a differently keyed M.2 connector relative to the M.2 connector and M.2 socket.

The M.2 standard allows module lengths of 30, 42, 60, 80, and 110 mm. In one example, the interposer may be dimensioned such that the length of the interposer plus the length of the module is equal to a standardized length. In another example, the form factor of the module is adjusted to fit a standardized length. In still another example, the length of the interposer and the module is maintained or unchanged.

In one example, the interposer is a printed circuit board (PCB) comprising a number of traces between the M.2 connector and the different form factor socket. The traces are arranged such that a number of pins associated with the M.2 connector are reassigned to corresponding pins in the different form factor socket. In another example, the interposer is a flexible cable including a number of traces between the M.2 connector and the different form factor socket. The traces are arranged such that a number of pins associated with the M.2 connector are reassigned to corresponding pins in the different form factor socket.

In one example, an auxiliary cable may be coupled between a motherboard or other printed circuit assembly (PCA) to which the interposer is coupled and the interposer. In this example, the auxiliary cable supports a number of interfaces not supported by the host-side M.2 socket located on the motherboard or PCA.

Thus, examples described herein provide a system to support multiple modules with full features and performance by adapting from one socket type to another through the use of an interposer. This examples described herein define a mechanism to adapt one M.2 socket type to second M.2 socket type, or from one M.2 socket type to another interface type. Each M.2 socket type has a unique keying preventing the plugging in of incompatible module types. This incompatibility is intentional as each M.2 socket type has a unique set of interfaces and a unique pinout. However, in order to work around the key layout restriction to allow different types of modules to couple to the computing system, save space on a printed circuit board to which a number of the M.2 sockets are coupled, and increase capacity and capability of the computing system, the interposer adapts from one M.2 socket type to a second M.2 socket type. This allows for different types of modules or a next-generation version of a module to be utilized in the computing system.

M.2 modules are rectangular, with M.2 standards allowing for module widths of 22, and 30 mm, and lengths of 30, 42, 60, 80, and 110 mm. An edge connector is included on a connecting edge of the M.2 module.

A semicircular or circular mounting hole is located at the center of the edge opposite the connecting edge. The M.2 module is installed into a mating connector provided by the computing system's printed circuit assembly (PCA) which includes the PCB and a number of components on the PCB. A number of mounting screws secure the module into place at the semicircular or circular mounting hole. The mounting screws may provide for a standoff distance between the M.2 module and the PCB by suspending the M.2 module above the PCB via the mating socket located on the PCB and the mounting screw. Components may be mounted on either side of the module, with the actual module type limiting how thick components may be. As a form factor standard, a maximum allowable thickness of a M.2 module is 1.5 mm per side. Different host-side sockets may be used for single- and double-sided M.2 modules, providing different amounts of space between the M.2 expansion card and the PCB. The PCB may support multiple standard lengths of M.2 modules. The sockets capable of accepting longer M.2 modules accept 30, 42, 60, 80, and 110 mm length M.2 modules by providing different mounting holes for the mounting screw.

The edge connector includes 75 positions with up to 67 pins. The pins overlap on different sides of the PCB of the M.2 module. Depending on the type of M.2 module, a number of pin positions may be removed to present one or more keying notches along the length of the connecting edge of the M.2 module. M.2 sockets located on the PCB may populate one or more mating key positions. The mating key positions determine the type of modules accepted by the host. For example, M.2 modules with two notches in the B and M positions use up to two PCI Express lanes and provide broader compatibility at the same time, while M.2 modules with only one notch in the M position use up to four PCI Express lanes. Both examples also support SATA storage devices.

Since each M.2 interface has its own set of interfaces and I/O signals, in some examples, one or more interfaces and I/O signals may not be provided via the examples of the interposer described herein. Therefore, other examples described herein provide an auxiliary cable that provides the missing interfaces to the interposer M.2 socket. The auxiliary cable may or may not be required depending on the type of modules to be supported through the interposer. For example, if the original M.2 socket is a socket 3 M keyed connector with 4 PCIe lanes, an auxiliary cable is not required to route the lanes to a interposer that supports PCIe on an A, B, or E keyed socket assuming the M.2 modules to be supported require no additional interfaces. On the other-hand, if additional interfaces are needed such as Display Port on a socket 1 A keyed socket, then they may be provided through an auxiliary cable.

As used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1A is a block diagram of an interposer for connecting a module to an M.2 socket comprising a different form factor connector, according to one example of the principles described herein. The interposer (202) includes an M.2 interposer edge connector (301) that matches an M.2 PCB socket (FIG. 2, 201). The interposer (202) also includes an interposer PCB (202-1) that carries signals via a number of traces to a different form factor socket (202-2) to couple the interposer (202) to a module that includes the different form factor connector. The different form factor socket (202-2) is formed to mate with the different form factor connector of the module. More details regarding the interposer (202) will now be described in more detail.

Figure 1B:
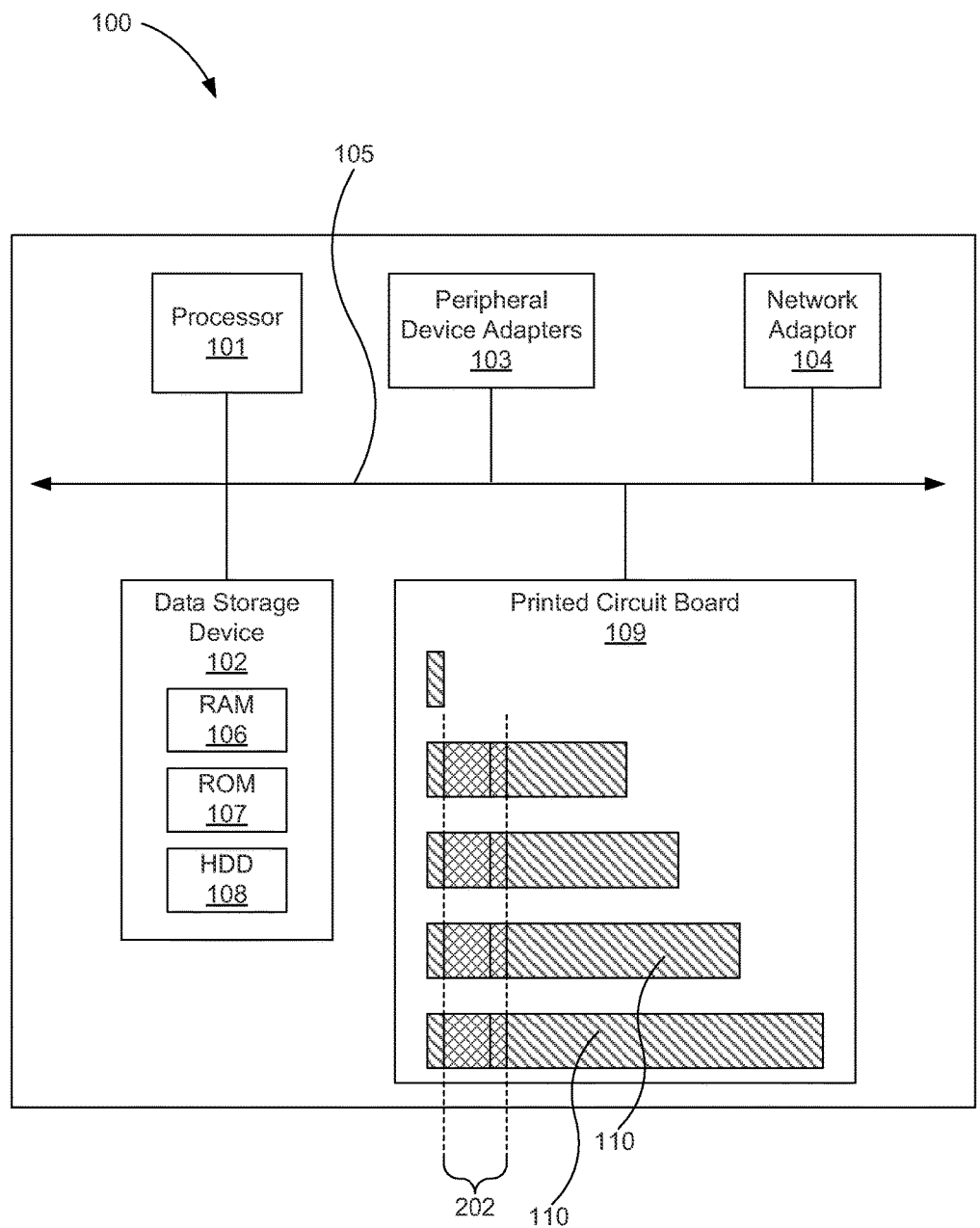
FIG. 1B is a block diagram of a computing system utilizing the interposer of FIG. 1A, according to one example of the principles described herein.

FIG. 1B is a block diagram of a computing system (100) utilizing the interposer (202) of FIG. 1A, according to one example of the principles described herein. The computing system (100) may be implemented as an electronic device such as, for example, servers, desktop computers, laptop computers, personal digital assistants (PDAs), workstations, mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) comprises various hardware components. Among these hardware components may be a number of processors (101), a number of data storage devices (102), a number of peripheral device adapters (103), a number of network adapters (104), and a printed circuit board (PCB) (109). These hardware components may be interconnected through the use of a number of busses and/or network connections. In one example, the processors (101), data storage devices (102), peripheral device adapters (103), network adapters (104), and PCB (109) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of identifying and utilizing a number of M.2 modules connected to a number of sockets of the PCB (109), according to the methods of the present specification described herein. In the course of executing code, the processor (101) may receive input from and provide output to a number of the remaining hardware units. In one example, the PCB (109) is any printed circuit board that may accommodate an M.2 socket and interface with a device with a mating M.2 connector. The PCB (109) may be, for example, a motherboard, an add-in card, a mezzanine card, a riser card, or other PCB card.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage devices (102) and any data storage devices described herein in connection with the PCB (109) may comprise a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, a display device, a mouse, or a keyboard. The peripheral device adapters (103) may also provide access to other external devices such as an external storage device, a number of network devices such as, for example, servers, switches, and routers, client devices, other types of computing devices, and combinations thereof.

Figure 2A:
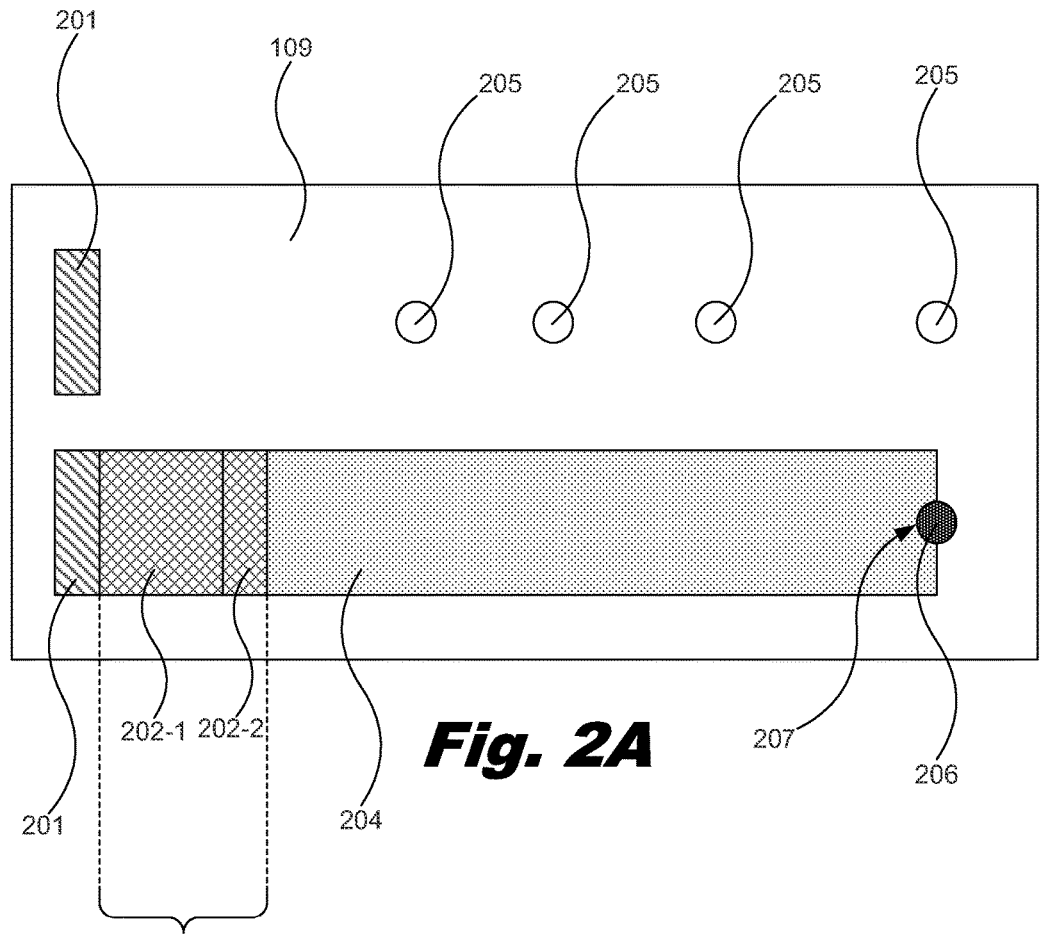
FIG. 2A is a top view block diagram of a M.2 printed circuit board (PCB) including an interposer, according to one example of the principles described herein.
Figure 2B:
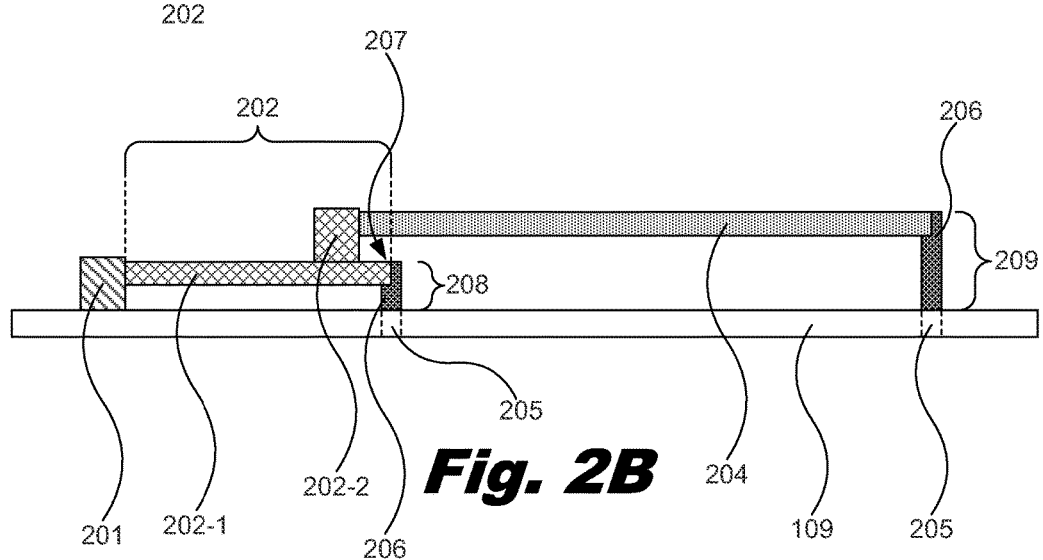
FIG. 2B is a side view block diagram of the M.2 PCB including the interposer of FIG. 2A, according to one example of the principles described herein.

The PCB (109) includes a number of M.2 modules (110). The PCB (109) also includes a number of interposers (202) as indicated by the dashed lines. The PCB (109) of the computing system (100) and its interposers (202) and M.2 modules (110) will now be described in more detail. FIG. 2A is a top view block diagram of a printed circuit board (PCB) (109) including an interposer (202), according to one example of the principles described herein. FIG. 2B is a side view block diagram of the PCB (109) including the interposer (202) of FIG. 2A, according to one example of the principles described herein. The PCB (109) may be a printed circuit assembly (PCA), a printed circuit board assembly (PCBA), a circuit card assembly (CCA), a backplane, a motherboard, a peripheral component interconnect express (PCIe) adapter, a riser, or other device to which an M.2 PCB socket (201) is coupled. As used in the present specification and in the appended claims, the terms "printed circuit board" or "PCB" is meant to be understood broadly as any substrate to which a PCB socket (201) is coupled.

As depicted in FIG. 2A, the PCB (109) may include a number of PCB sockets (201). Although two PCB sockets (201) are depicted in FIG. 2A, any number of sockets may be included in a PCB (109). The top socket (201) is left empty with no M.2 module (204) coupled thereto in order to depict a number of mounting holes (205) that are defined within the PCB (109). The mounting holes (205) are used in conjunction with a mounting pole (206) to mount the M.2 modules (204) and the interposer (202) to the PCB (109). In one example, the mounting pole (206) comprises a rod coupled to the PCB (109) upon which the M.2 modules (204) and the interposer (202) rest. In another example, the mounting pole (206) includes a threaded cylinder. In this example, the M.2 module (204) and the interposer (202) include the semicircular or circular mounting holes (FIG. 2A, 207 and FIG. 3, 305) defined in their respective PCBs as described above. A mounting screw is passed through the semicircular or circular mounting holes and threaded into the mounting pole (206). Apart from providing structural support for the M.2 modules (204) and the interposer (202), the mounting pole (206) may serve to assist in heat dissipation among the M.2 modules (204) and the interposer (202).

The mounting holes (205) depicted in FIG. 2A may be defined within the PCB (109) at positions where a standard length M.2 module (204) may end. As described above, these standard lengths include, for example, 16, 26, 30, 38, 42, 60, 80 and 110 mm from the PCB sockets (201) and match the semicircular or circular mounting holes (FIG. 207) of the M.2 modules (204) when the M.2 modules (204) are coupled to the PCB sockets (201).

Figure 3:
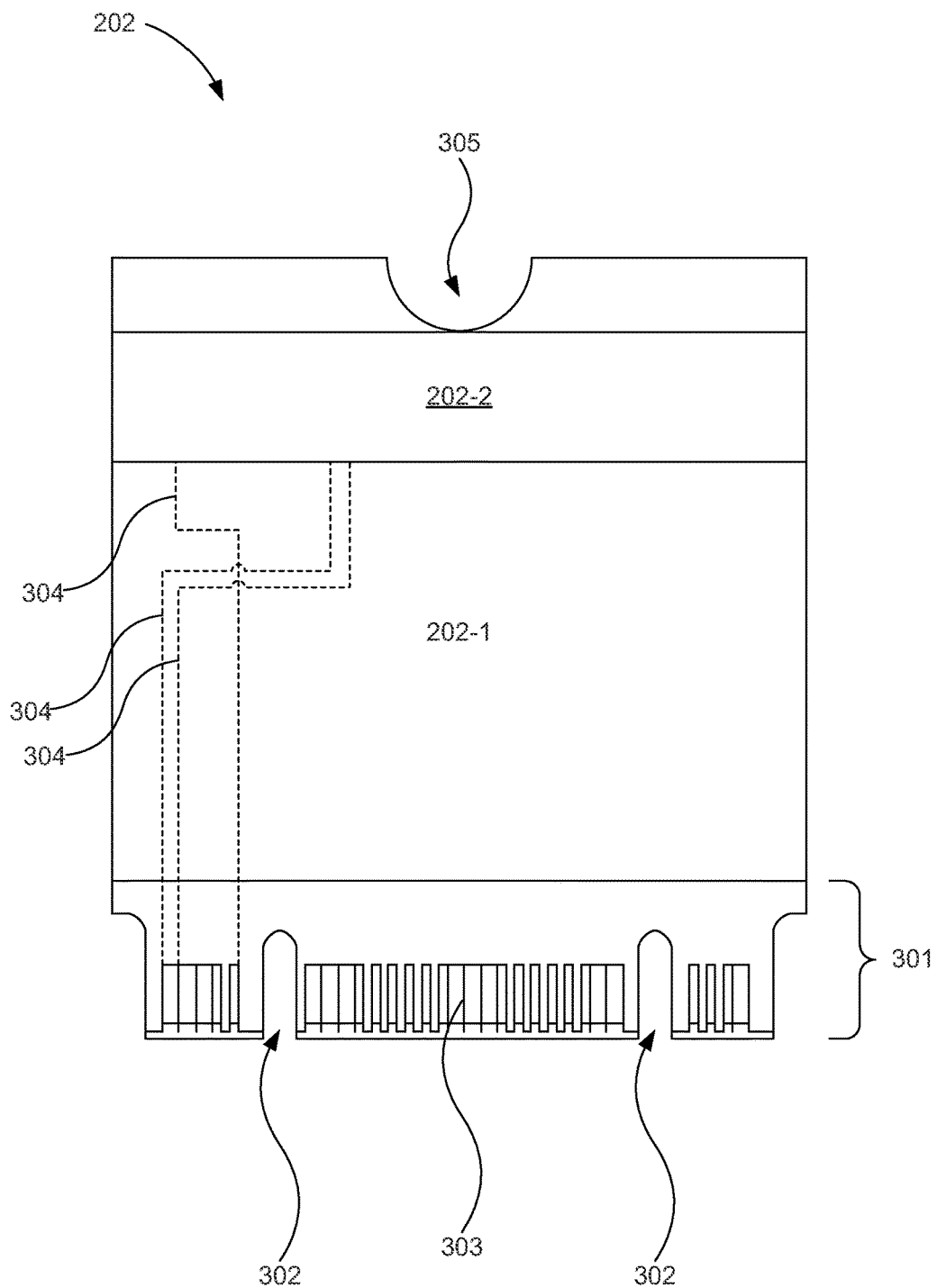
FIG. 3 is a top view of the interposer of FIGS. 2A and 2B, according to one example of the principles described herein.

The interposer (202) comprises an interposer PCB (202-1) and an interposer socket (202-2). FIG. 3 is a top view of the interposer (202) of FIGS. 2A and 2B, according to one example of the principles described herein. The interposer PCB (202-1) includes an edge connector (301) that is used to couple the interposer (202) to the PCB sockets (201) located on the PCB (109). The edge connector (301) comprises a number of notches (302) and a number of pins (303) in a configuration based on the type of M.2 keying and form factor associated with the PCB socket (201). With this matching configuration, the interposer (202) may couple the PCB socket (201) to an M.2 module (204) with a differently keyed edge connector. In this manner, the PCB sockets (201) and the interposer (202) include mating notch (302) and pin (303) layouts that are different from the M.2 module (204).

A number of traces (304) are included within the interposer PCB (202-1) to rearrange the keying of the interposer socket (202-2) relative to the PCB sockets (201) and the edge connector (301) of the interposer (202). The traces (304) are wires for conducting signals from the PCB sockets (201) located on the PCB (109), through the interposer (202), and into the M.2 modules (204). Only a few traces (304) are depicted in FIG. 3. However, any number of traces (304) may be provided in order to rearrange the pin (303) assignment of the PCB sockets (201) to match the pin assignments that support an M.2 module (204) to be inserted into the interposer socket (202-2). In this manner, a differently keyed M.2 module (204) relative to the PCB socket (201) and the interposer (202) is able to electrically interface with PCB sockets (201) via the interposer (202) that the differently keyed M.2 module (204) would otherwise not be able to electrically interface with.

Further, in one example, the interposer PCB (202-1) provides different edge connector (301) form factors between the host computing system (100) side of the interposer (202) and the M.2 module (204) side of the interposer (202). As mentioned above, different M.2 modules (204) may also have different edge connector form factors including different orientations and placements of the notches (302). In this situation, the edge connector (301) of the interposer (202) may include a notch (302) arrangement as depicted in FIG. 3, but the interposer socket (202-2) may be configured to accept an M.2 module (204) with a different edge connector form factor including different orientations and placements of notches (302). In this manner, an M.2 module (204) with a different edge connector form factor relative to the PCB socket (201) and the interposer (202) is able to physically interface with the PCB socket (201) via the interposer (202) that the M.2 module (204) would otherwise not be able to physically interface with.

Returning to FIG. 2B, the interposer (202) and the M.2 module (204) may each have a standoff distance (208, 209) relative to the PCB (109). As depicted in FIG. 2B, the standoff distance (208) of the interposer (202) relative to the PCB (109) is smaller than the standoff distance (209) of the M.2 module (204) relative to the PCB (109). This is the case because the PCB socket (201) and the interposer socket (202-2) are located on top of the PCB (109) and interposer PCB (202-1), respectively. In one example, the standoff distances (208, 209) provided by the PCB socket (201) and the interposer socket (202-2) are set at standard standoff distances (208, 209).

Figure 4A:
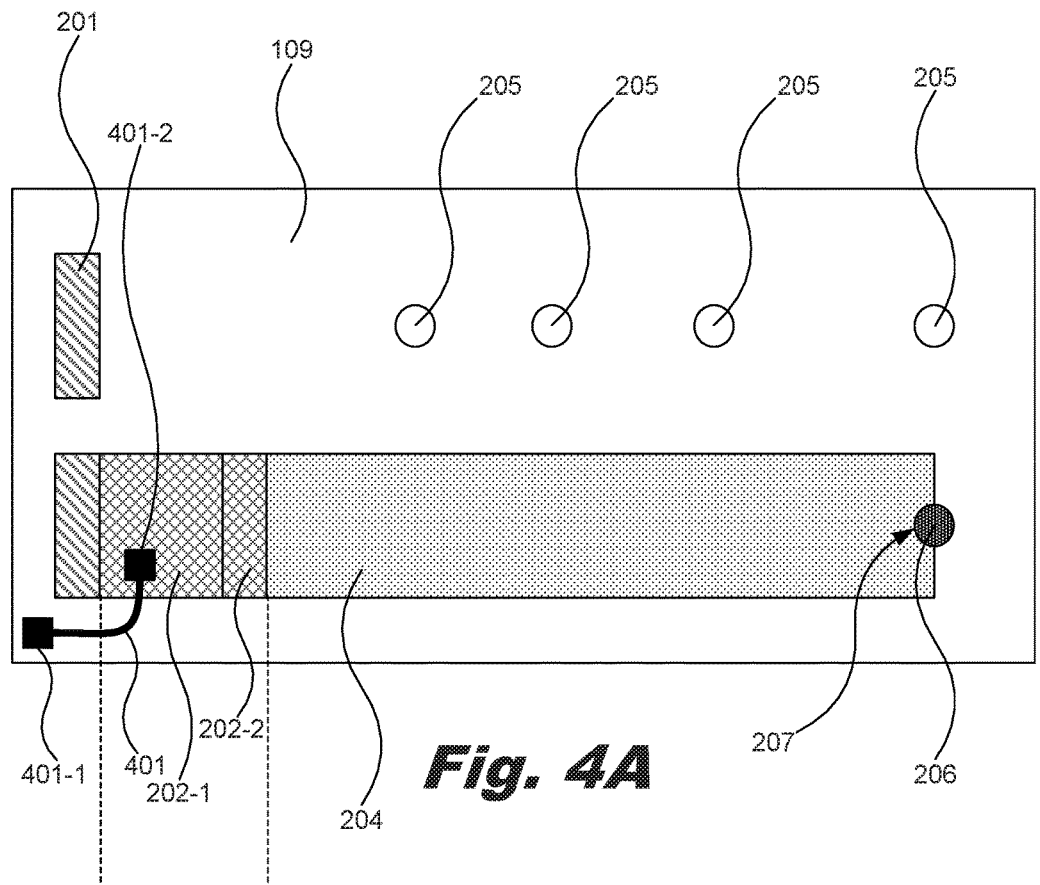
FIG. 4A is a top view block diagram of a PCB including an interposer and an auxiliary cable, according to one example of the principles described herein.
Figure 4B:
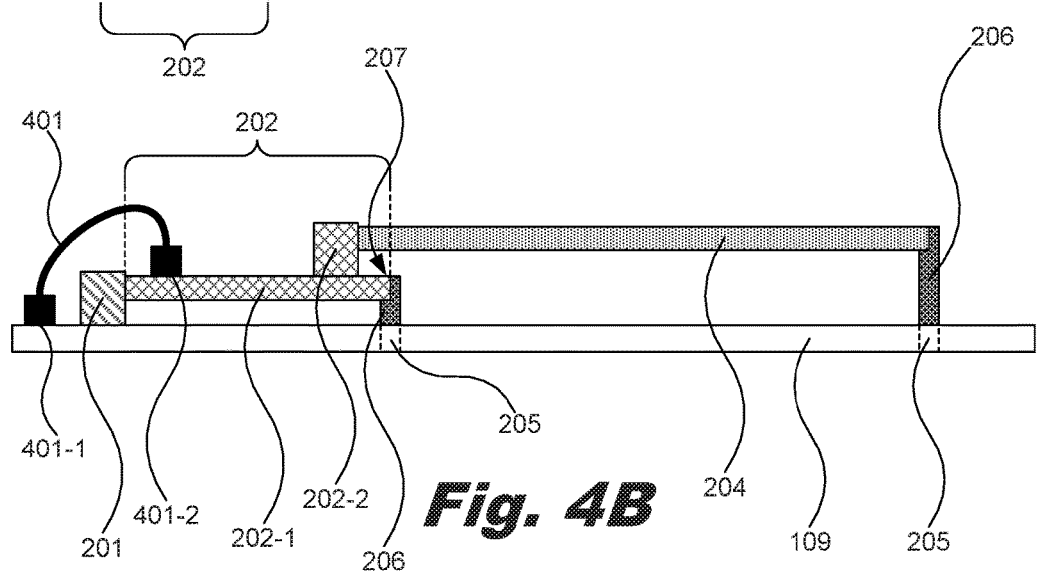
FIG. 4B is a side view block diagram of the PCB including the interposer and auxiliary cable of FIG. 4A, according to one example of the principles described herein.

FIG. 4A is a top view block diagram of a PCB (109) including an interposer (202) and an auxiliary cable (401), according to one example of the principles described herein. FIG. 4B is a side view block diagram of the PCB (109) including the interposer (202) and auxiliary cable (401) of FIG. 4A, according to one example of the principles described herein. Elements in FIGS. 4A and 4B that are similar to elements present in FIGS. 2A and 2B are described in detail above.

The example of FIGS. 4A and 4B, however, include an auxiliary cable (401). In some situations, the PCB socket (201) of the PCB (109) may not support all the signals required by the M.2 module (204) a user wishes to install into the PCB socket (201). For example, the PCB socket (201) may be keyed to support memory modules such as SSD modules, and the M.2 module (204) the user wishes to install into the PCB socket (201) may be a communications module such as a NFC communication module. In this example, the PCB socket (201) may not support all the signals required by the M.2 module (204). Therefore, the example of FIGS. 4A and 4B provide an auxiliary cable (401) that is used to transfer those missing signals that are not provided by the PCB socket (201).

In one example, the auxiliary cable (401) is attached to a first auxiliary connector (401-1) located on the PCB (109) that provides the missing signals as depicted in FIGS. 4A and 4B. In another example, the missing signals may be routed from another device or PCB within the computing system (100). The signals are transmitted from the first auxiliary connector (401-1) to a second auxiliary connector (401-2) via the auxiliary cable (401). The second auxiliary connector (401-2) is coupled to a portion of the interposer (201) where the missing signals are transmitted over a number of traces (FIG. 3, 304) to the interposer socket (202-2). The interposer (202) is able to provide the missing signals to the M.2 module (204) through the auxiliary cable (401) that were not available to the M.2 module (204)

through the PCB socket (201). In this manner, those interfaces and their associated signals not supported by PCB socket (201) are made available via the auxiliary cable (401) of FIGS. 4A and 4B.

Although the above examples describe utilizing the interposer (202) to adapt from one type of M.2 key layout, signal transmission, or edge connector form factor to another M.2 key layout, signal transmission, or edge connector form factor, any type of connector may be adapted from the M.2 key layout, signal transmission, or edge connector form factor. For example, the interposer (202) may be used to adapt the PCB sockets (201) that support an M.2 module (204) to a non-M.2 connector and its associated key layout, signal transmission, or edge connector form factor. These non-M.2 formats include, for example, a type C connector, a PCIe connector, a mini PCIe connector, a SATA connector, an mSATA connector, or an OCULINK connector developed by the PCI SIG, among many others.

In the example of adapting from an M.2 type connector to an OCULINK connector, the side of the interposer (202) opposite the PCB (109) would be coupled to a cable since the OCULINK connector is a small cable form factor that supports optical and copper signal transfer mediums. Thus, the interposer (202) provides for the adaptation of types of connectors other than an M.2 connector that is different in both fit and function relative to an M.2 connector.

Figure 5:
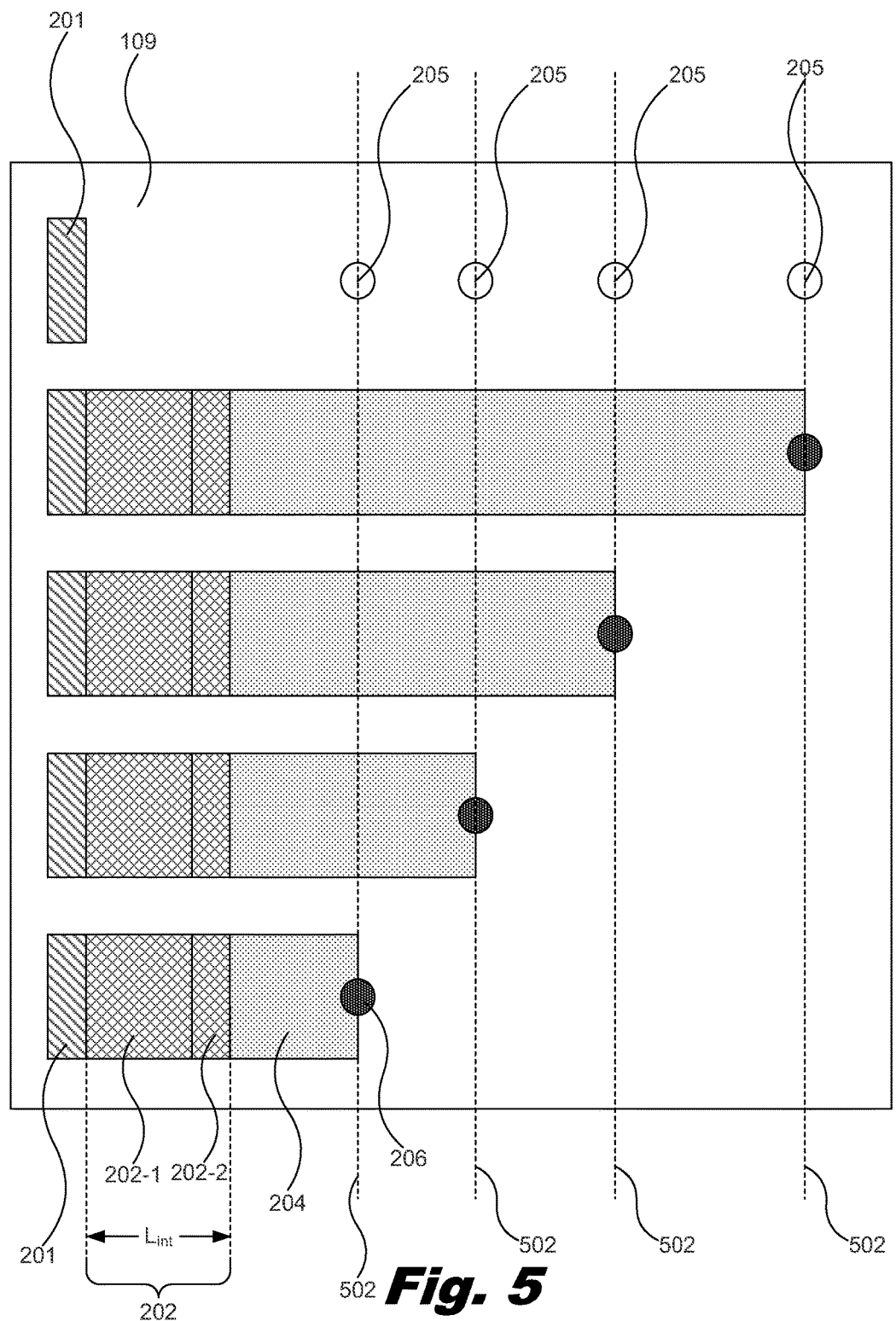
FIG. 5 is a top view block diagram of a PCB including a number of interposers coupled to a number of M.2 modules, wherein a form factor of the M.2 modules is adjusted, according to one example of the principles described herein.

FIG. 5 is a top view block diagram of a PCB (109) including a number of interposers (202) coupled to a number of M.2 modules (204), wherein a form factor of the M.2 modules (204) is adjusted, according to one example of the principles described herein. When mounting the interposer (202) onto the PCB socket (201), the length (Ln) of the interposer (202) causes a number of standard form factor lengths of the M.2 module (204) to not match up with the mounting holes (205). This creates a situation where a semicircular or circular mounting holes (FIG. 207 and FIG. 3, 305) defined in the PCBs of the interposers (202) and M.2 modules (204), respectively, are not available at a standard mounting hole position (502) in order for the M.2 module (204) to be coupled to the PCB (109).

In the example of FIG. 5, the length form factor of the M.2 modules (204) are adjusted order to align the ends of the M.2 modules (204) with the standard mounting hole positions (502) defined within the PCB (109). Thus, in some examples, the length form factor of the M.2 modules (204) is reduced relative to a standard M.2 module length. In another example, the length form factor of the M.2 modules (204) is increased relative to a standard M.2 module length. In this manner, the M.2 modules (204) are able to be mounted to the PCB (109) without having to modify the PCB (109), or manufacture or purchase a specialized PCB (109).

Figure 6:
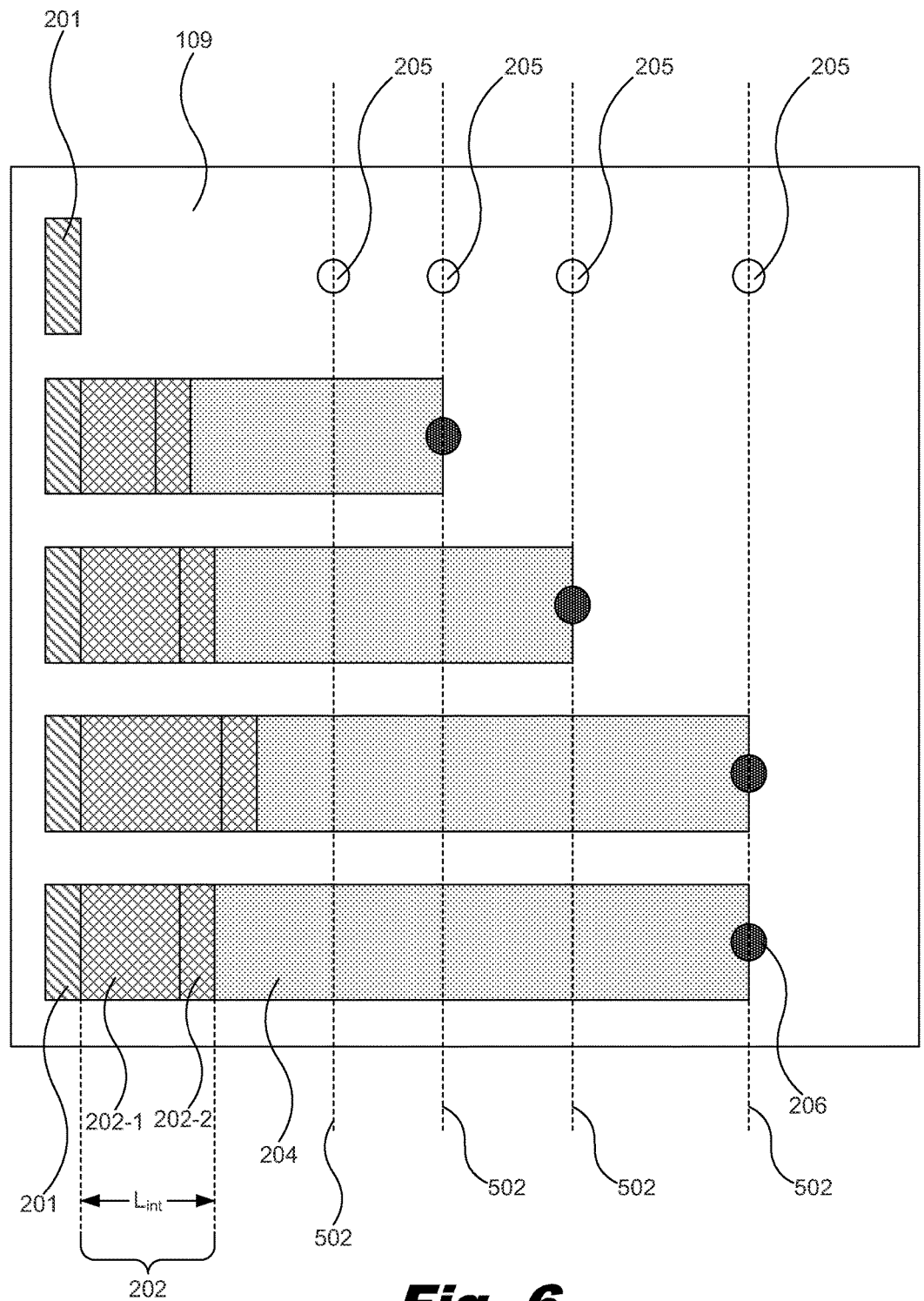
FIG. 6 is a top view block diagram of a PCB including a number of interposers coupled to a number of M.2 modules, wherein the form factor of the interposers is adjusted based on a form factor of the M.2 modules, according to one example of the principles described herein.

FIG. 6 is a top view block diagram of a PCB (109) including a number of interposers (202) coupled to a number of M.2 modules (204), wherein the form factor of the interposers (202) is adjusted based on a form factor of the M.2 modules (204), according to one example of the principles described herein. In contrast to the example of FIG. 5 where the length of the M.2 module (204) was variable, the example of FIG. 6 provides for a variable length ($L_{int}$) of the interposer (202). This creates a situation where a number of standard form factor lengths of the M.2 modules (204) match up with the mounting holes (205) to allow for coupling of the M.2 modules (204) to the PCB (109).

In the example of FIG. 5, the length form factor of the interposers (202) are adjusted in order to align the ends of the M.2 modules (204) with the standard mounting hole positions (502) defined within the PCB (109). Thus, in some examples, the length form factor of the interposers (202) is reduced. In another example, the length form factor of the interposers (202) is increased. In this manner, the M.2 modules (204) are able to be mounted to the PCB (109) without having to modify the PCB (109), or manufacture or purchase a specialized PCB (109).

Figure 7:
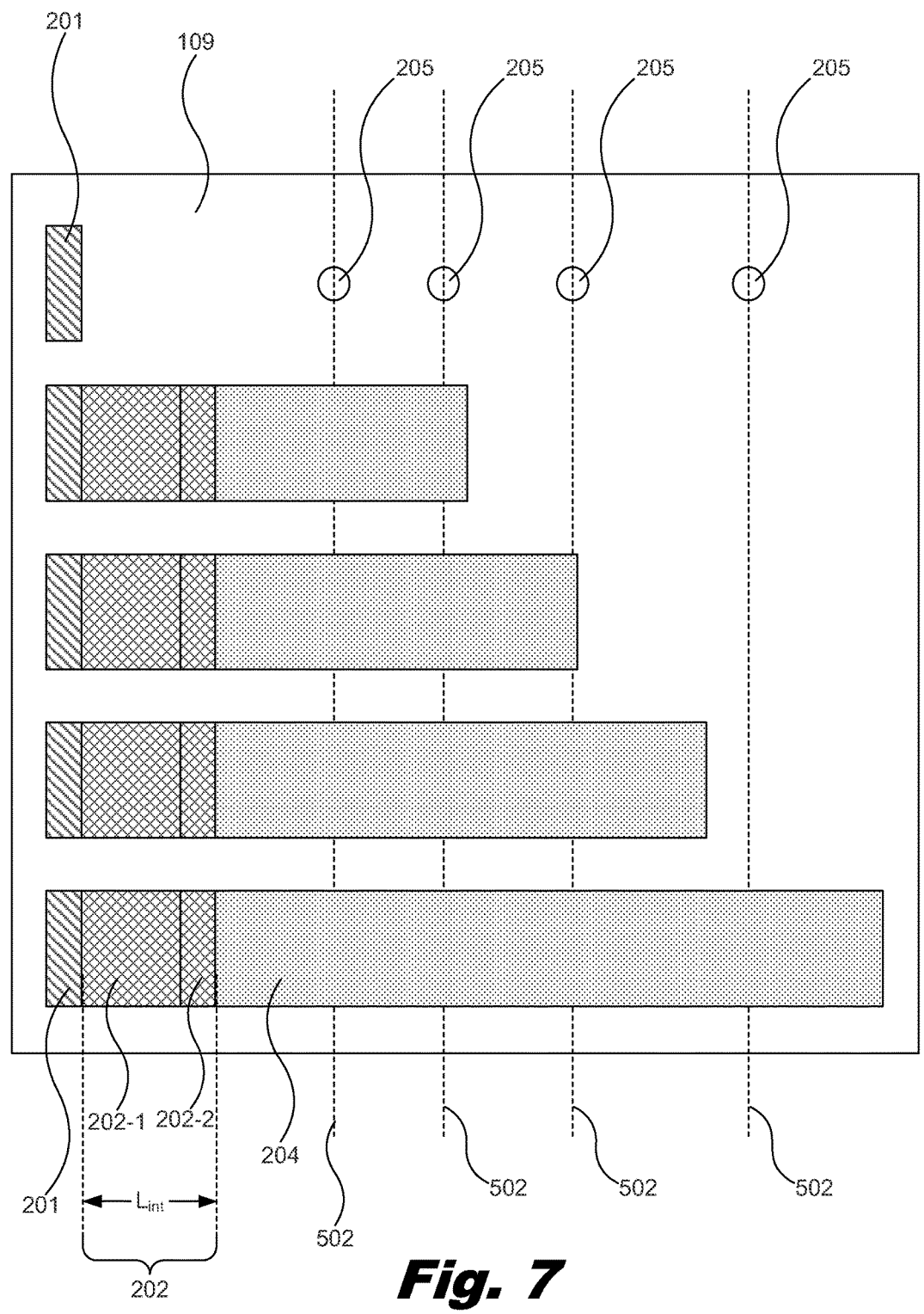
FIG. 7 is a top view block diagram of a PCB including a number of interposers coupled to a number of M.2 modules M.2 modules wherein the form factor of the interposers and the form factor of the M.2 modules are not adjusted, according to another example of the principles described herein.

FIG. 7 is a top view block diagram of a PCB (109) including a number of interposers (202) coupled to a number of M.2 modules (204) wherein the form factor of the interposers (202) and the form factor of the M.2 modules (204) are not adjusted, according to another example of the principles described herein. In the example, of FIG. 7, the length ($L_{int}$) of the interposer (202) causes a number of standard form factor lengths of the M.2 module (204) to not match up with the mounting holes (205) in a similar manner as depicted in the example of FIG. 5. This creates a situation where a semicircular or circular mounting holes (FIG. 207 and FIG. 3, 305) defined in the PCBs of the interposers (202) and M.2 modules (204), respectively, are not available at a standard mounting hole position (502) in order for the M.2 module (204) to be coupled to the PCB (109). In the example of FIG. 7, the M.2 modules (204) may be mounted to the PCB (109) at intermediary portions of the M.2 modules (204) rather than the ends. In another example, a modified PCB (109) may be manufactured such that the mounting hole positions (502) are defined within the modified PCB (109) at positions where the length of the M.2 modules (204) plus the length of the interposers (202) is equal to one of the mounting hole positions (502) in the modified PCB (109).

In still another example, the existing hole positions (502) may be used, but the M.2 modules (204) may be designed to extend out to the a next length where an existing hole position (502) is located. In this example, other component interferences may be altered to meet the design of the M.2 modules (204).

Figure 8:
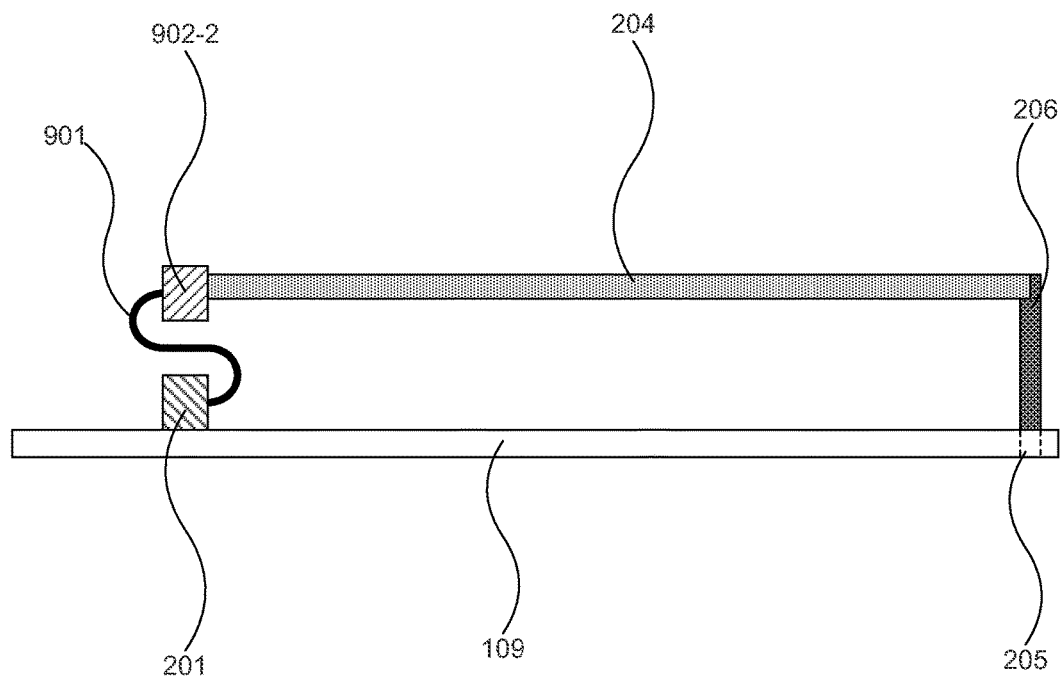
FIG. 8 is a side view block diagram of the PCB including a flexible cable interposer that does not shift the overall length of the M.2 module from a standard length, according to one example of the principles described herein.

FIG. 8 is a side view block diagram of the PCB (109) including a flexible cable interposer (902) that does not shift the overall length of the M.2 module (204) from a standard length, according to one example of the principles described herein. In one example, the flexible cable interposer (902) may comprise a flexible cable with an interposer socket (902-2) coupled to the M.2 module (204) side of the flexible cable interposer (902). The flexible cable interposer (902) is able to couple to the PCB socket (201) located on the PCB (109) at a position on the PCB socket (201) where an M.2 module may be inserted. The flexible cable interposer (902) may flex to a position where the interposer socket (902-2) can couple with the edge connector of the M.2 module (204). The M.2 module (204) may be coupled to the PCB (109) at a standard mounting hole (205). This eliminates the potential need to modify the PCB (109), or manufacture or purchase a specialized PCB (109).

Figure 9:
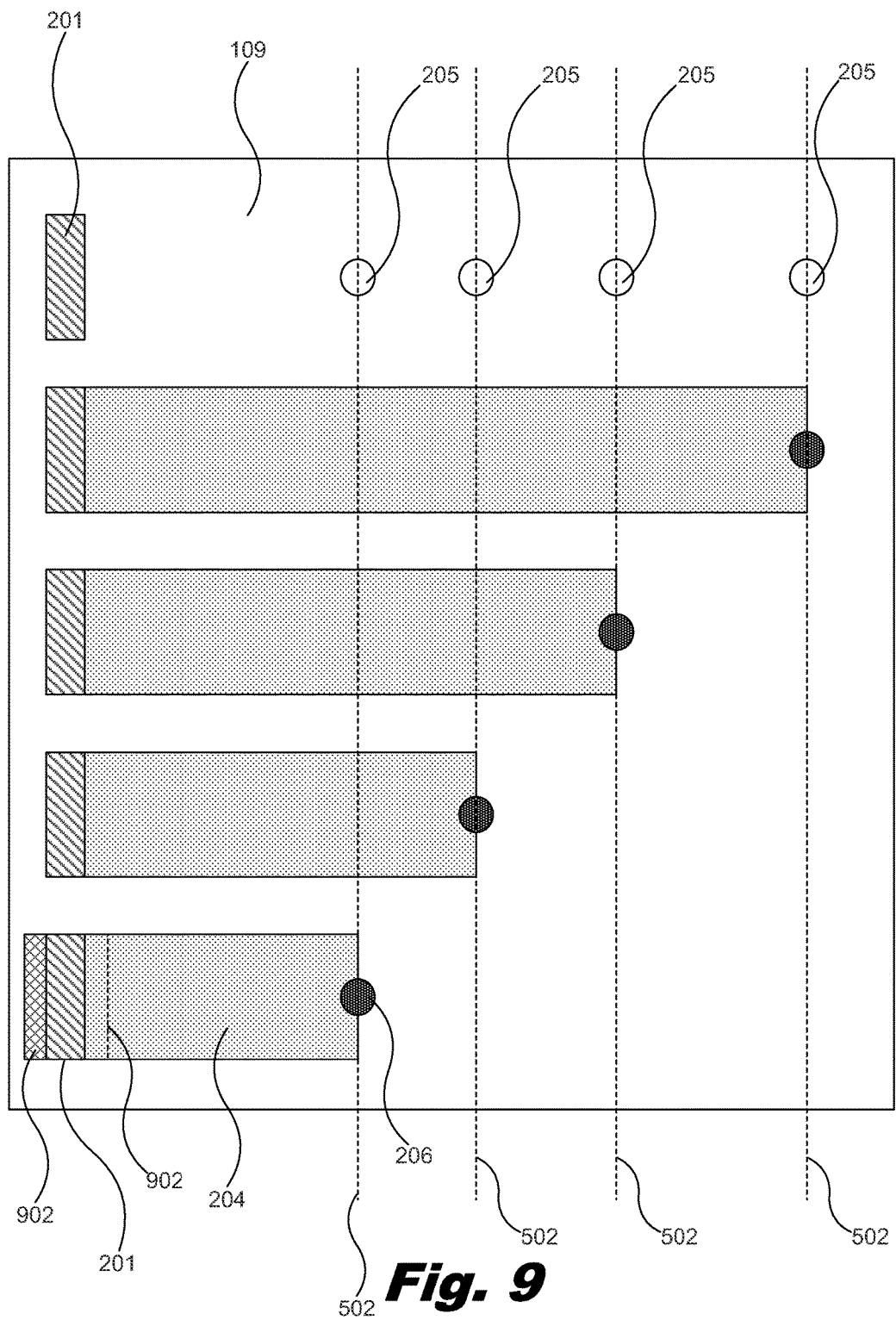
FIG. 9 is a top view block diagram of a PCB including a number of interposers coupled to a number of M.2 modules, wherein the interposers do not shift the overall length of the M.2 modules from a standard length, according to one example of the principles described herein.

In one example, the flexible cable interposer (902) is flexible enough to connect to the M.2 module (204) as described above, but rigid enough to support the coupling end of the M.2 module (204). In another example, the M.2 module (204) may be mounted to the PCB (109) at another location other than a terminal end of the M.2 module (204). FIG. 9 is a top view block diagram of a PCB (109) including a number of interposers (902) coupled to a number of M.2 modules (204), wherein the interposers do not shift the overall length of the M.2 modules (204) from a standard length (502), according to one example of the principles described herein. The flexible cable interposer (901) is depicted in FIG. 9 to the left of the PCB socket (201) and extending under the M.2 module (204) as depicted in ghost.

In this example, the length of the flexible cable interposer (901) does not affect the ability to mount the M.2 modules (204) at a standard mounting hole position (502). Although the example of the flexible cable interposer (901) is depicted in FIG. 9, any structure may be used in a similar manner to ensure that the mount the M.2 modules (204) may be mounted at a standard mounting hole position (502).

Figure 10A:
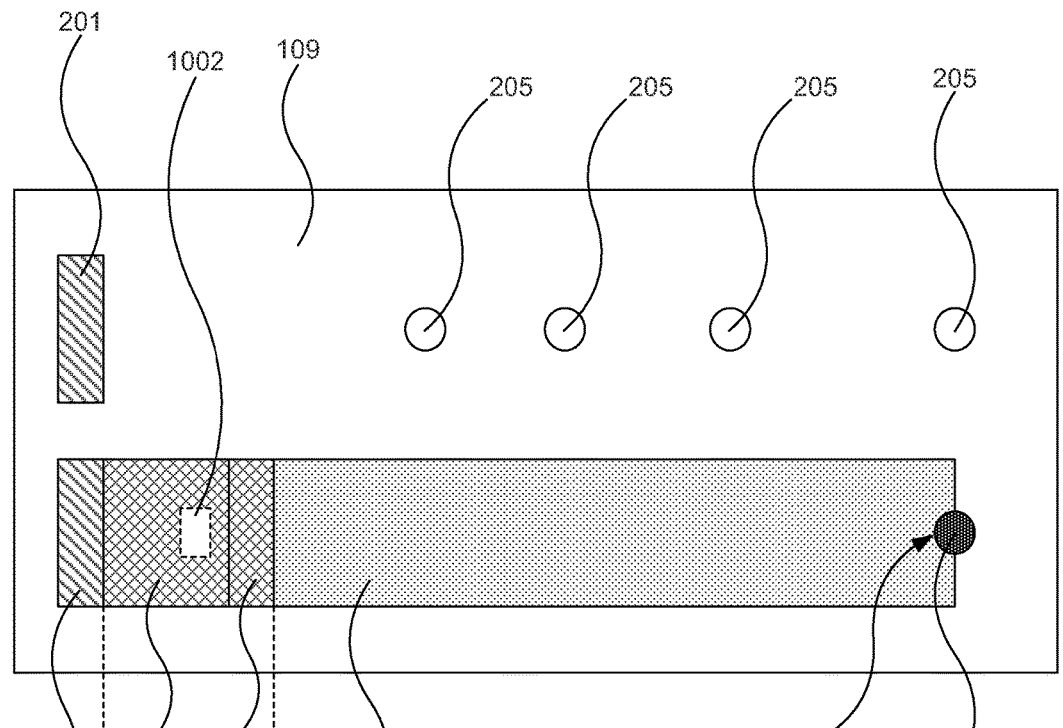
FIG. 10A is a top view block diagram of a printed circuit board (PCB) including an interposer and a rigid auxiliary connector, according to another example of the principles described herein.
Figure 10B:
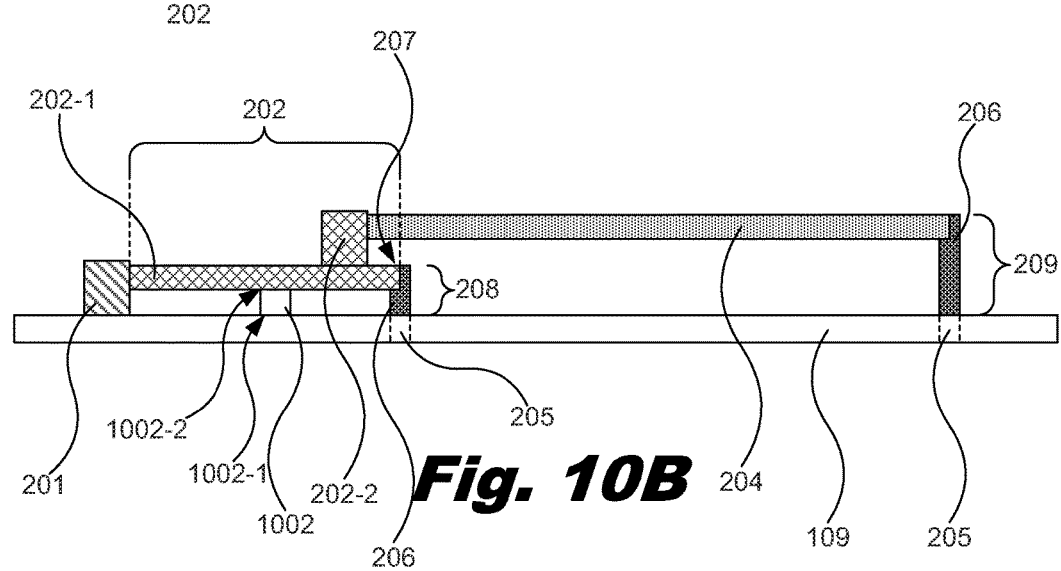
FIG. 10B is a side view block diagram of the M.2 PCB including the interposer and the rigid auxiliary connector of FIG. 10A, according to another example of the principles described herein.

FIG. 10A is a top view block diagram of an M.2 printed circuit board (PCB) (109) including an interposer (202) and a rigid auxiliary connector (1002), according to another example of the principles described herein. FIG. 10B is a side view block diagram of the M.2 PCB (109) including the interposer (202) and the rigid auxiliary connector (1002) of FIG. 10A, according to another example of the principles described herein. Elements in FIGS. 10A and 10B that are similar to elements present in, for example, FIGS. 2A and 2B are described in detail above.

The example of FIGS. 10A and 10B, however, includes a rigid auxiliary connector (1002). As similarly described above in connection with the auxiliary cable (401), in some situations, the PCB socket (201) of the PCB (109) may not support all the signals required by the M.2 module (204) a user wishes to install into the PCB socket (201), and may not support all the signals required by the M.2 module (204). Therefore, the example of FIGS. 10A and 10B provide the rigid auxiliary connector (1002) that is used to transfer those missing signals that are not provided by the PCB socket (201).

As depicted in FIGS. 10A and 10B, the rigid auxiliary connector (1002) is attached to an interface (1002-1) located on the PCB (109) that provides the missing signals. In this example, the rigid auxiliary connector (1002) may be fabricated into the PCB (109) to couple any number of interposers (202) to the PCB (109).

In another example, the rigid auxiliary connector (1002) may be fabricated into the interposer (202). In this example, the interposer (202) is fabricated with a connector that couples to a mating connector located on the PCB (109). This example avoids connector costs burdening the PCA (109) when the rigid auxiliary connector (1002) is not in use.

In any of the examples of FIGS. 10A and 10B, a number of traces are included in the rigid auxiliary connector (1002) to carry a number of signals not provided by the PCB socket (201) through the rigid auxiliary connector (1002) into the interposer (202) and to the M.2 module (204). The signals are transmitted from the first rigid auxiliary connector interface (1002-1) to a second rigid auxiliary connector interface (1002-2) via the rigid auxiliary connector (1002). The second rigid auxiliary connector interface (1002-2) is coupled to a portion of the interposer (202) where the missing signals are transmitted over a number of traces (FIG. 3, 304) to the interposer socket (202-2). The interposer (202) is able to provide the missing signals to the M.2 module (204) through the rigid auxiliary connector (1002) that were not available to the M.2 module (204) through the PCB socket (201). In this manner, those interfaces and their associated signals not supported by PCB socket (201) are made available via the rigid auxiliary connector (1002) of FIGS. 10A and 10B. The rigid auxiliary connector (1002) may include any types or style of connector.

Further, although the rigid auxiliary connector (1002) is depicted in FIGS. 10A and 10B as being located between the PCB (109) and the interposer PCB (202-1), the rigid auxiliary connector (1002) may couple the PCB (109) and the interposer PCB (202-1) from any other location on the PCB (109). In another example, the missing signals may be routed from another device or PCB within the computing system (100) other than or in addition to PCB (109). The example of FIGS. 10A and 10B provide a low-cost solution and may avoid potential electromagnetic interference (EMI) or even mechanical interference that may be experienced in a cabled solution.

The specification and figures describe an interposer for connecting a module to an M.2 socket includes a different form factor connector. The interposer includes an M.2 connector to couple the interposer to the M.2 socket. The M.2 connector is formed to mate with the M.2 socket. The interposer includes a different form factor socket to couple the interposer to the module including the different form factor connector. The different form factor socket is formed to mate with the different form factor connector. This interposer may have a number of advantages, including: (1) providing increased flexibility, capacity, and capability of a computing system that utilizes the interposer; (2) saving dedicated PCB space; (3) reducing the number of M.2 sockets supported on the PCB resulting in a reduction in cost associated with the design, manufacturing, and sale of the computing system.

The preceding description has been presented to illustrate and describe examples of the principles described. This description is not intended to be exhaustive or to limit these principles to any precise form disclosed. Many modifications and variations are possible in light of the above teaching.

What is claimed is:

1. An interposer for connecting a module to an M.2 printed circuit board (PCB) socket comprising:
   an M.2 connector to couple the interposer to the M.2 PCB socket, the M.2 connector formed to mate with the M.2 PCB socket and associated with a first M.2 keying; and
   an interposer socket to couple the interposer to the module, the interposer socket associated with a different keying relative to the M.2 PCB socket, the module comprising a module connector to mate with the interposer socket,
   wherein the interposer is dimensioned such that the length of the interposer plus the length of the module is equal to a distance between the M.2 PCB socket and a mounting hole defined in PCB to which the M.2 PCB socket is coupled.

2. The interposer of claim 1, wherein the interposer socket and module connector comprise a differently-keyed M.2 socket and a differently-keyed M.2 connector relative to the M.2 connector and M.2 PCB socket.

3. The interposer of claim 1, wherein the interposer is the PCB comprising a number of traces between the M.2 connector and the interposer socket that are arranged such that a number of pins associated with the M.2 connector are reassigned to corresponding pins in the interposer socket.

4. The interposer of claim 1, wherein the interposer is a flexible cable comprising a number of traces between the M.2 connector and the interposer socket that are arranged such that a number of pins associated with the M.2 connector are reassigned to corresponding pins in the interposer socket.

5. The interposer of claim 1, further comprising an auxiliary cable coupled between the PCB to which the interposer is coupled and the interposer, the auxiliary cable to support a number of interfaces not supported by the M.2 PCB socket.

6. A system for connecting a computing device to a module comprising:
   an M.2 printed circuit board (PCB) socket coupled to a PCB of the computing device;

an interposer comprising:
  an M.2 connector comprising a number of notches and pins assigned based on a first M.2 keying layout and formed to mate with the M.2 PCB socket; and
  an M.2 interposer socket to couple the interposer to a module connector coupled to the module, the M.2 interposer socket to receive a connector with a number of notches and pins assigned based on a different M.2 keying layout relative to the M.2 PCB socket, the M.2 interposer socket formed to mate with the module connector,
  wherein the interposer is dimensioned such that the length of the interposer plus the length of the module is equal to a standardized length; and
  a mounting hole to affix the interposer to the PCB of the computing device.

7. The system of claim 6, wherein the PCB is any printed circuit board that accommodates an M.2 socket including a motherboard, an add-in card, a mezzanine card, or a riser card.

8. The system of claim 6, wherein the second socket and second connector comprise a differently-keyed M.2 socket and a differently-keyed M.2 connector relative to the M.2 connector and M.2 socket.

9. The system of claim 6, wherein the interposer is a printed circuit board (PCB) comprising a number of traces between the M.2 connector and the M.2 interposer socket that are arranged such that a number of pins associated with the M.2 connector are reassigned to corresponding pins in the M.2 interposer socket to enable the module to send and receive data as required to provide intended functionality to the computer module.

10. The system of claim 6, wherein the interposer is a flexible cable comprising a number of traces between the M.2 connector and the M.2 interposer socket that are arranged such that a number of pins associated with the M.2 connector are reassigned to corresponding pins in the M.2 interposer socket to enable the module to send and receive data as required to provide intended functionality to the computer module.

11. The system of claim 6, further comprising a rigid auxiliary connector coupled between the PCB and the interposer, the rigid auxiliary connector to support a number of interfaces not supported by the M.2 PCB socket but required by the M.2 interposer socket.

12. An interposer for connecting an M.2 socket to a module comprising a differently-keyed M.2 connector comprising:
  an M.2 connector to couple the interposer to the M.2 socket, the M.2 connector formed to mate with the M.2 socket;
  a differently-keyed M.2 socket differently keyed relative to the M.2 socket to couple the interposer to the module comprising the differently-keyed M.2 connector, the differently-keyed M.2 socket formed to mate with the differently-keyed M.2 connector; and
  an auxiliary cable coupled between a printed circuit board (PBC) of the computing device and the interposer, the auxiliary cable supporting a number of interfaces not supported by the M.2 socket but required by the differently-keyed M.2 socket and its associated module.

13. The interposer of claim 12, wherein the interposer is a flexible cable comprising a number of traces between the M.2 connector and the differently-keyed M.2 socket that are arranged such that a number of pins associated with the M.2 connector are reassigned to corresponding pins in the differently-keyed M.2 socket to enable the module to send and receive data as required to provide intended functionality to the computer module.

14. The interposer of claim 1, wherein the interposer is dimensioned such that the length of the interposer plus the length of the module is equal to a standardized length.

15. The interposer of claim 1, wherein the PCB is a printed circuit board that accommodates an M.2 socket including a motherboard, an add-in card, a mezzanine card, or a riser card.

16. The interposer of claim 1, comprising a rigid auxiliary connector coupled between the PCB and the interposer.

17. The interposer of claim 16, wherein the rigid auxiliary connector is fabricated into the interposer.

18. The system of claim 6, wherein the interposer is dimensioned such that the length of the interposer plus the length of the module is equal to a distance between the M.2 PCB socket and a mounting hole defined in the PCB to which the M.2 PCB socket is coupled.

19. The system of claim 6, comprising a rigid auxiliary connector coupled between the PCB and the interposer.

20. The system of claim 19, wherein the rigid auxiliary connector is fabricated into the interposer.

* * * * *

UNITED STATES PATENT AND TRADEMARK OFFICE
CERTIFICATE OF CORRECTION

PATENT NO. : 10,483,673 B2
APPLICATION NO. : 15/543193
DATED : November 19, 2019
INVENTOR(S) : Byron A Alcorn et al.

Page 1 of 1

It is certified that error appears in the above-identified patent and that said Letters Patent is hereby corrected as shown below:

In the Claims

In Column 12, Line 42, in Claim 1, delete "in PCB" and insert -- in a PCB --, therefor.

In Column 14, Line 13, in Claim 12, delete "(PBC)" and insert -- (PCB) --, therefor.

Signed and Sealed this
Eleventh Day of February, 2020

Andrei Iancu
*Director of the United States Patent and Trademark Office*